US008023556B2

(12) United States Patent
Green et al.

(10) Patent No.: US 8,023,556 B2
(45) Date of Patent: Sep. 20, 2011

(54) AUTONOMOUSLY GENERATING RAMP PROFILES IN A TRANSCEIVER

(75) Inventors: Brian D. Green, Austin, TX (US); Lysander Lim, Austin, TX (US); Kishore Ganti, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 1086 days.

(21) Appl. No.: 11/731,869

(22) Filed: Mar. 30, 2007

(65) Prior Publication Data
US 2008/0240211 A1 Oct. 2, 2008

(51) Int. Cl.
H04B 13/02 (2006.01)
(52) U.S. Cl. ........................................ 375/219; 375/297
(58) Field of Classification Search .......... 375/219–222, 375/297, 345
See application file for complete search history.

(56) References Cited

U.S. PATENT DOCUMENTS

| 4,739,321 | A | * | 4/1988 | Friedman et al. ............. 370/445 |
| 7,324,496 | B1 | * | 1/2008 | Sooch et al. .................. 370/345 |
| 2002/0071482 | A1 | * | 6/2002 | Peters et al. ................. 375/222 |
| 2004/0102207 | A1 | * | 5/2004 | Wenzel et al. ................ 455/522 |
| 2004/0166823 | A1 | | 8/2004 | Alderton .................... 455/250.1 |
| 2005/0064828 | A1 | * | 3/2005 | Kurakami et al. ......... 455/115.1 |
| 2006/0050812 | A1 | * | 3/2006 | Hietala et al. ................. 375/308 |
| 2006/0135093 | A1 | * | 6/2006 | Ito et al. ..................... 455/126 |
| 2006/0170499 | A1 | * | 8/2006 | Rahman et al. .............. 330/279 |
| 2006/0239337 | A1 | | 10/2006 | Green et al. ................. 375/219 |
| 2006/0245483 | A1 | | 11/2006 | Green et al. ................. 375/220 |
| 2007/0072652 | A1 | * | 3/2007 | Shan et al. ................... 455/570 |
| 2007/0104098 | A1 | * | 5/2007 | Kimura et al. ............... 370/229 |
| 2007/0142007 | A1 | * | 6/2007 | Yan ............................ 455/127.1 |
| 2007/0190952 | A1 | * | 8/2007 | Waheed et al. ............ 455/114.3 |
| 2007/0281651 | A1 | * | 12/2007 | Oosawa et al. ............ 455/245.1 |
| 2008/0002786 | A1 | * | 1/2008 | Kerth et al. .................. 375/297 |

FOREIGN PATENT DOCUMENTS

| WO | WO 02/13493 | 2/2002 |
| WO | WO 2004/030228 | 4/2004 |
| WO | WO 2006/115928 | 11/2006 |

OTHER PUBLICATIONS

PCT/US2006/014700 International Search Report with Written Opinion of the International Searching Authority Mailed Jul. 28, 2006.
Digital Interface Working Group, "DigRF Baseband/RF Digital Interface Specification," Feb. 20, 2004, pp. 1-28.
Silicon Laboratories, "Aero® IIed DigRF Interface Transceiver and ABB for GSM/GPRS/EDGE," Sep. 18, 2006, pp. 1-2.
U.S. Patent and Trademark Office, Office Action dated May 26, 2009 with Reply filed on Aug. 26, 2009, in U.S. Appl. No. 11/478,924.
U.S. Patent and Trademark Office, Final Office Action dated Dec. 28, 2009 with Reply to Final filed on Feb. 25, 2010, and Advisory Action issued on Mar. 25, 2010 in U.S. Appl. No. 11/478,924.

* cited by examiner

Primary Examiner — Emmanuel Bayard
(74) Attorney, Agent, or Firm — Trop, Pruner & Hu, P.C.

(57) ABSTRACT

In one implementation, a method includes receiving control information in a transceiver from a baseband processor and computing ramp values in the transceiver based on the control information. The ramp values may be computed in a signal generator of the transceiver such as an algorithmic generator. Depending on mode of operation, the ramp values may be provided to a power amplifier or a gain block of the transceiver.

21 Claims, 6 Drawing Sheets

AUTONOMOUSLY GENERATING RAMP PROFILES IN A TRANSCEIVER

FIELD OF THE INVENTION

Embodiments of the present invention relate to high frequency communications and, more particularly, to wireless communication systems such as cellular telephones.

BACKGROUND

A wireless device such as a cellular telephone typically includes various components that communicate status, control and data information to each other. For example, a cellular telephone typically includes a transceiver that is adapted to transmit and receive at radio frequencies (RF). Cellular telephones further include a baseband processor that operates at baseband frequencies. Typically, information used to control the transceiver is provided from the baseband processor via digital signals on multiple pins, such as general purpose input/output (GPIO) pins. Additionally, baseband processors typically transmit radio data (e.g., voice information) to the transceiver via analog signals. Because there is a significant amount of information that is needed to be transferred, numerous such pins are needed, raising complexity, cost and consuming additional chip real estate.

For various reasons, digital interface communication protocols have been discussed in the communications industry, particularly with respect to cellular phones. One such effort has resulted in the DigRF Baseband/RF Digital Interface Specification currently available on the Internet at the following URL—http://www.ttpcom.com/digrf. This specification defines certain logical, electrical and timing characteristics for a digital interface between an RF integrated circuit (RFIC) such as a transceiver and a baseband processor.

For many mobile systems, including those compliant with the DigRF standard, exchange and storage of power control ramping information represents a major problem in terms of software/firmware complexity and/or hardware cost. Many systems provide ramp profile information from a baseband processor to the RFIC. However, to digitally transmit this data, complex operations are needed for conveying the transmit power control ramp information, as well as constructing appropriate power control ramp profiles. This complexity, from a baseband processor perspective, is both arduous in terms of software (e.g., programming) and RFIC interface traffic. One solution is to pre-store ramps in memory of the RFIC. This memory can be loaded once or infrequently by the baseband processor and accessed, e.g., on a transmit burst-by-burst basis by the RFIC. However this solution has some key disadvantages, as it may require high voltage or nonvolatile memory on the RFIC which is physically large (to achieve low leakage current). Furthermore, a large amount of memory may be needed if all possible ramping profiles are to be pre-stored.

SUMMARY OF THE INVENTION

In one aspect, the present invention includes an apparatus that can autonomously compute ramp profiles for use, either in the apparatus itself or by a power amplifier (PA) coupled thereto. That is, an apparatus such as a transceiver may have multiple transmission paths such as a first path to receive and process baseband data in a first mode of operation to generate a radio frequency (RF) signal for output via a common output path and a second path to receive and process the baseband data in a second mode of operation to generate the RF signal for output via the common output path.

Another aspect is directed to a method for receiving control information in a transceiver from a baseband processor and computing ramp values in the transceiver based on the control information. To this end, the transceiver may include an interface to receive the information from the baseband processor, and the ramp values may be computed in a signal generator of the transceiver, such as an algorithmic generator. In one implementation, the generator may include a first summer to combine an output of a first delay element and an output of a multiplier, a second summer to combine the output of the first delay element and an output of a second delay element, where the multiplier is to multiply an output of the second summer by a predetermined value. The generator may further include an adder coupled to sum an output of the algorithmic hardware engine and an offset value. Depending on the mode of operation, the ramp values may be output to a PA or a gain block of the transceiver.

Yet another aspect of the present invention is directed to a system that includes multiple transmission paths, at least one of which is coupled to a power amplifier. More specifically, the multiple transmission paths may be implemented in a transceiver having a digital interface to communicate digital control information between a processor and the transceiver and an engine to autonomously generate ramp profiles. Embodiments of the present invention may be implemented in appropriate hardware, firmware, and software. To that end, one embodiment may be implemented in a system for wireless transmission. Still other embodiments may include a system including an integrated circuit such as a transceiver along with additional components.

DETAILED DESCRIPTION

Embodiments of the present invention may provide for autonomous generation of ramp profiles in a transceiver. More specifically, based on a minimal amount of control information from a baseband processor, the transceiver may autonomously compute ramp profiles for use in a variety of communication modes. For example, ramp profiles may be generated for both linear and non-linear operation to accommodate multiple communication modes including, for example, a Gaussian minimum shift keying (GMSK) modulation scheme and an 8-phase shift keying (8-PSK) modulation scheme. In this way, a minimal amount of information can be communicated between baseband processor and transceiver. Furthermore, the expense of large storage in the transceiver such as lookup tables, nonvolatile memory or so forth can be avoided.

While the scope of the present invention is not limited in this regard, in many implementations a transceiver may be configured to communicate with a corresponding baseband processor digitally, e.g., according to the DigRF specification. Using such embodiments, digital control information (which may be highly parameterized information regarding ramp generation) can be received from the baseband processor and used to generate ramp profiles autonomously. In one such embodiment for a given multi-slot burst, this control information from the baseband processor may include a single minimum value for the ramp and a single maximum value for each burst of the multi-slot communication. Accordingly, a minimal amount of information may be communicated and used to autonomously generate desired ramp profiles.

Figure 1:
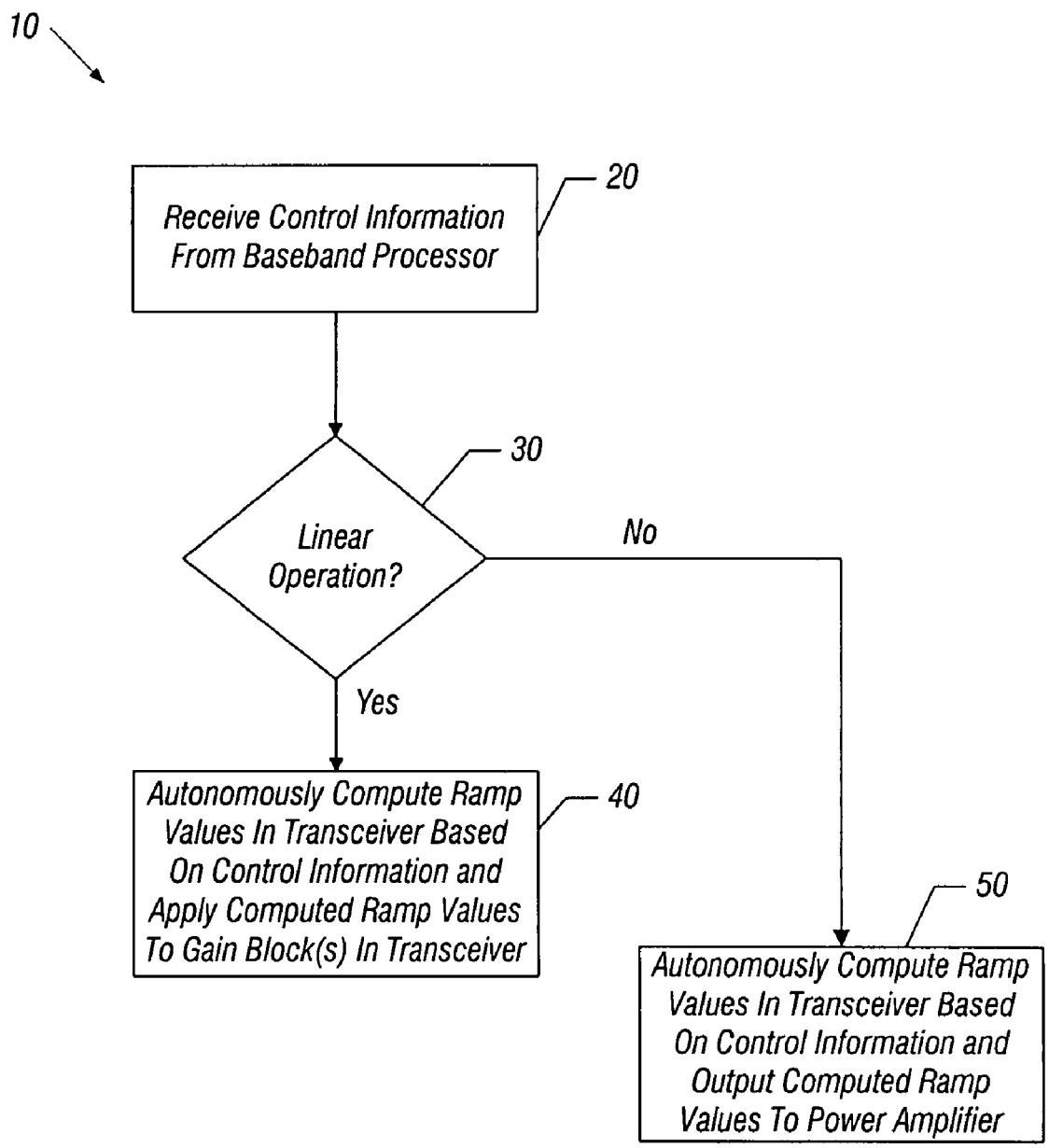
FIG. 1 is a flow diagram of a method in accordance with one embodiment of the present invention.

Referring now to FIG. 1, shown is a flow diagram of a method in accordance with one embodiment of the present invention. As shown in FIG. 1, method 10 may be implemented in a transceiver such as a transceiver of a mobile station or other communication device that is coupled between a baseband processor and a power amplifier (PA) in the transmit direction.

As shown in FIG. 1, method 10 may begin by receiving control information from the baseband processor (block 20). For example, such control information with regard to embodiments of the present invention may constitute a minimal amount of ramp control information, namely a minimum value for, e.g., a multi-slot communication burst, as well as a single maximum value for each burst of the communication. While not shown in the embodiment of FIG. 1, it is to be understood that the received control information from the baseband processor may be stored in a temporary storage such as a register, buffer or so forth until it is used to generate one or more ramp profiles. In some embodiments, this information may be received digitally, e.g., via a DigRF interface.

This control information may be used to compute ramp values. For example, a transceiver may include at least one signal generator that can generate a ramp profile from this minimal amount of control data. While the scope of the present invention is not limited in this regard, in various implementations a hardware generator such as an algorithmic hardware engine may receive input information and at a given frequency generate samples so that a desired number of samples for the ramp profile can be generated. As one example, 14 samples may be used to generate a desired ramp profile. The output of this signal generator may further be processed, e.g., in accordance with the control information to generate the ramp samples for ramp generation.

Still with reference to FIG. 1, next it may be determined whether the power amplifier with which the transceiver is associated is operating in a linear mode (diamond 30). For example, the PA may operate in a linear mode for an 8-PSK modulation scheme, while the PA may operate in a non-linear mode for a GMSK modulation scheme. If non-linear operation is active, control may pass to block 50, where the ramp values may be autonomously computed and output to the PA (block 50). That is, the transceiver may autonomously compute ramp values based on the received control information. As used herein, the term "autonomous" means that the transceiver performs calculations and generates ramp profiles itself, rather than either receiving generated ramps from the baseband processor or merely interpolating a full ramp profile from a limited number of ramp samples received from the baseband processor. Using these ramp values, the PA may generate the desired waveforms for transmission through an associated antenna.

If instead at diamond 30 it is determined that operation is in a linear mode, control may pass to block 40 where the ramp values may be autonomously computed and applied to one or more gain blocks in the transceiver. For example, the ramp profile information may be provided to an analog variable gain amplifier (AVGA) that is used to amplify incoming baseband data (e.g., in-phase and quadrature (I/Q) data) prior to modulation within the transceiver. While shown with this particular implementation in the embodiment of FIG. 1, the scope of the present invention is not limited in this regard.

Figure 2:
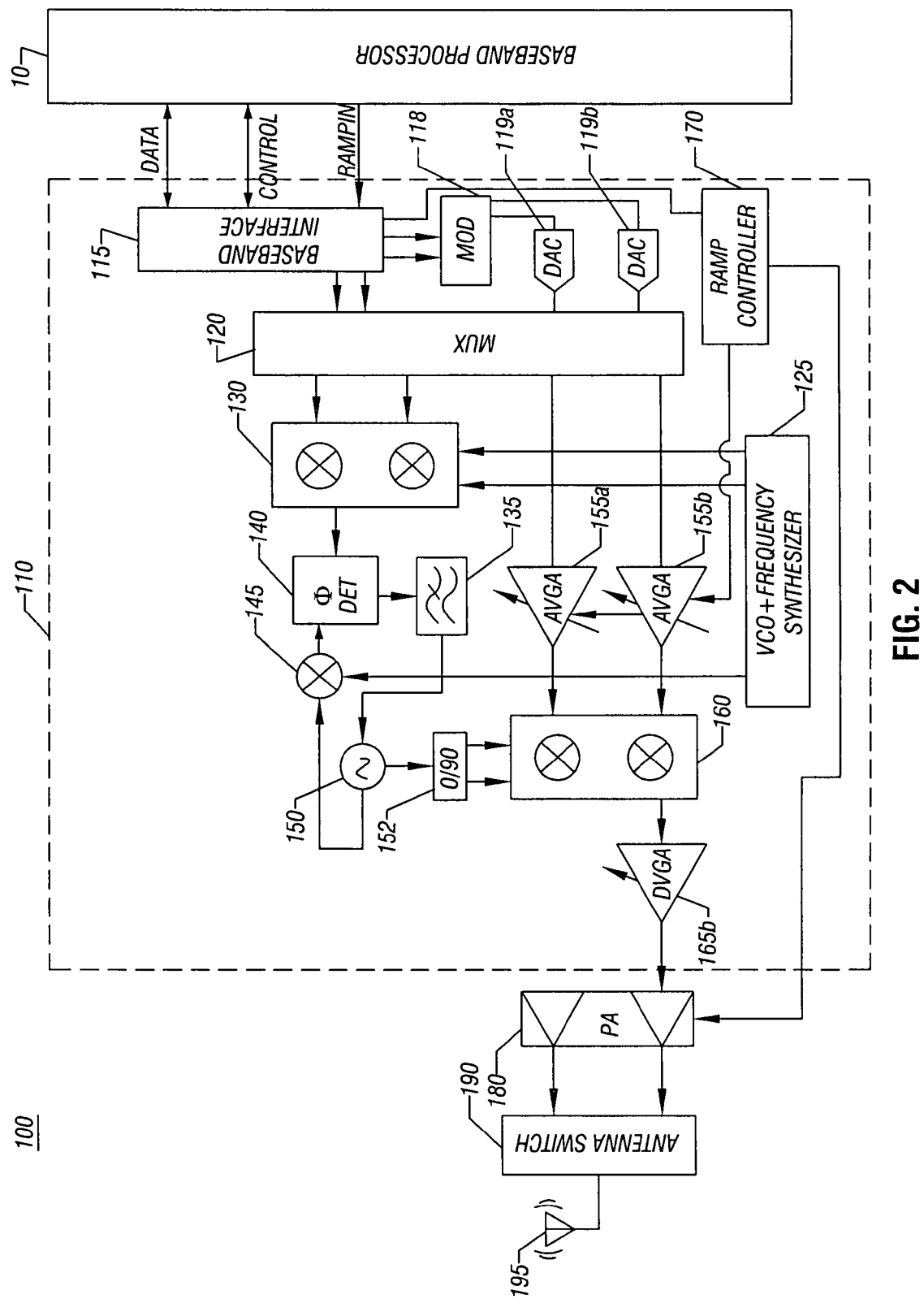
FIG. 2 is a block diagram of a transceiver in accordance with an embodiment of the present invention.

Embodiments may be implemented in many different RFICs, such as transceivers and so forth. Referring now to FIG. 2, shown is a block diagram of a transceiver in accordance with an embodiment of the present invention. As shown in FIG. 2, a transceiver 110 may be implemented in a system 100 such as a wireless device, e.g., a cellular telephone handset, personal digital assistant (PDA) or other such device. Transceiver 110 may include both receive and transmit circuitry, although the transmit circuitry only is shown in the embodiment of FIG. 2 for ease of illustration. As shown in FIG. 2, transceiver 110 is coupled to a baseband processor 10. Accordingly, baseband communication may occur between transceiver 110 and baseband processor 10. Transceiver 110 is further coupled to a power amplifier (PA) 180, which in turn is coupled to an antenna switch 190 that itself is coupled to an antenna 195. In accordance with an embodiment of the present invention transceiver 110 may be adapted in a single integrated circuit (IC) transceiver that includes both receive and transmit paths and various control circuitry, in one embodiment.

Still referring to FIG. 2, transceiver 110 includes various circuitry to enable receipt of baseband signals from baseband processor 10 and processing thereof to provide RF outputs to PA 180. Accordingly, transceiver 110 includes a baseband interface 115, which may be a digital interface, e.g., in accordance with the DigRF specification to provide coupling to baseband processor 10. As shown in FIG. 2, baseband interface 115 is coupled in a bidirectional manner with baseband processor 10 to enable transmission and receipt of baseband I and Q signals, as well as the receipt of incoming control signals (e.g., ramp control signals) from baseband processor 10. Of course, additional control signals for controlling operation of transceiver 110 may further be received from baseband processor 10.

Baseband data signals are provided from baseband interface 115 to a modulator 118, where the digital signals may be modulated. The modulated signals may then be output to a pair of digital-to-analog converters (DACs) 119a and 119b to generate analog I and Q signals that are provided to a multiplexer 120. Multiplexer 120 may be controlled to provide outputs to different paths depending on the mode of operation (e.g., GMSK mode or 8-PSK mode).

In various implementations, multiplexer 120 may provide incoming baseband signals to a selected one of multiple transmission paths. Thus the embodiment of FIG. 2 shows a dual transmitter design in which different transmit paths are present. These different paths may be controlled differently in different modes of operation. For example, in a GMSK mode, I/Q signals are provided to a first transmission path including an offset phase lock loop (OPLL), while in an 8-PSK mode, I/Q signals are provided to a second transmission path including a digital variable gain mixer.

In GMSK mode, I and Q data is provided to the first transmission path that includes a mixer 130 which may be an intermediate frequency (IF) mixer, which is controlled to mix the incoming signals with a frequency provided by a frequency synthesizer 125. The signals from frequency synthesizer 125 provided to mixer 130 are used to upconvert the I and Q signals to a desired intermediate frequency.

As shown in FIG. 2, the OPLL may include a phase detector 140, which is coupled to receive the upconverted modulated signals from mixer 130. As further shown in FIG. 2, phase detector 140 is further coupled to receive an output from a mixer 145. Mixer 145 in turn is controlled via another output from frequency synthesizer 125. Feedback will operate to equalize the frequency inputs to phase detector 140.

In turn, the output of phase detector 140 is provided to a filter 135. The filtered output is fed to a local oscillator (LO) 150 that is coupled in a feedback loop with mixer 145. The output of mixer 145 equals the sum/difference frequency of the inputs thereto, namely the output of LO 150, and the output of frequency synthesizer 125. By controlling a frequency output from frequency synthesizer 125, the output of LO 150 is a modulated signal generated at a desired frequency, which is output to a divider/quadrature phase shifter 152 which provides complex signals to a mixer 160 of the second transmission path. Divider/shifter 152 may be configured, for example, as a divide by 2 or divide by 4, in various implementations, or other integers.

A mixer 160 and DVGA 165 of the second transmission path may form a digital variable gain mixer. That is, while shown as separate components in the embodiment of FIG. 2, mixer 160 and DVGA 165 may be implemented with unified circuitry, in some embodiments.

The signals amplified in DVGA 165 are thus provided out of transceiver 110. Transceiver 110 may be coupled to PA 180 that receives the RF signals from transceiver 110. Furthermore, as shown in FIG. 2, PA 180 may be controlled via signals received from transceiver 110. In various embodiments, transceiver 110 further includes a ramp controller 170. Ramp controller 170 may be used to autonomously generate ramp profiles based on limited control information from baseband processor 10. Thus ramp controller 170 may include one or more dedicated hardware engines to generate ramp profiles that may be provided for use both within transceiver 110 (e.g., in a 8-PSK mode) and by PA 180 (e.g., in a GMSK mode). Specifically, as shown in FIG. 2, during a GMSK mode of operation, ramp profiles generated in ramp controller 170 may be provided to PA 180.

Referring still to FIG. 2, the second transmission path of transceiver 110 enables transmission of signals of a different mode of operation than the first transmission path. Specifically, as shown in FIG. 2, the second transmission path is coupled to receive I and Q data from multiplexer 120 at a pair of analog variable gain amplifiers/attenuators (AVGAs) 155a and 155b (generically AVGA 155). Note that AVGAs 155a and 155b may be controlled by ramp signals generated by ramp controller 170 in 8-PSK mode. The output signals from these amplifiers/attenuators may be filtered in respective low pass filters (LPFs) 158a and 158b (generically LPF 158). In 8-PSK mode, mixer 160 receives baseband currents from the second transmission path which are mixed with an unmodulated pure carrier signal from LO 150, which it then provides to DVGA 165 for subsequent output to PA 180.

Figure 3:
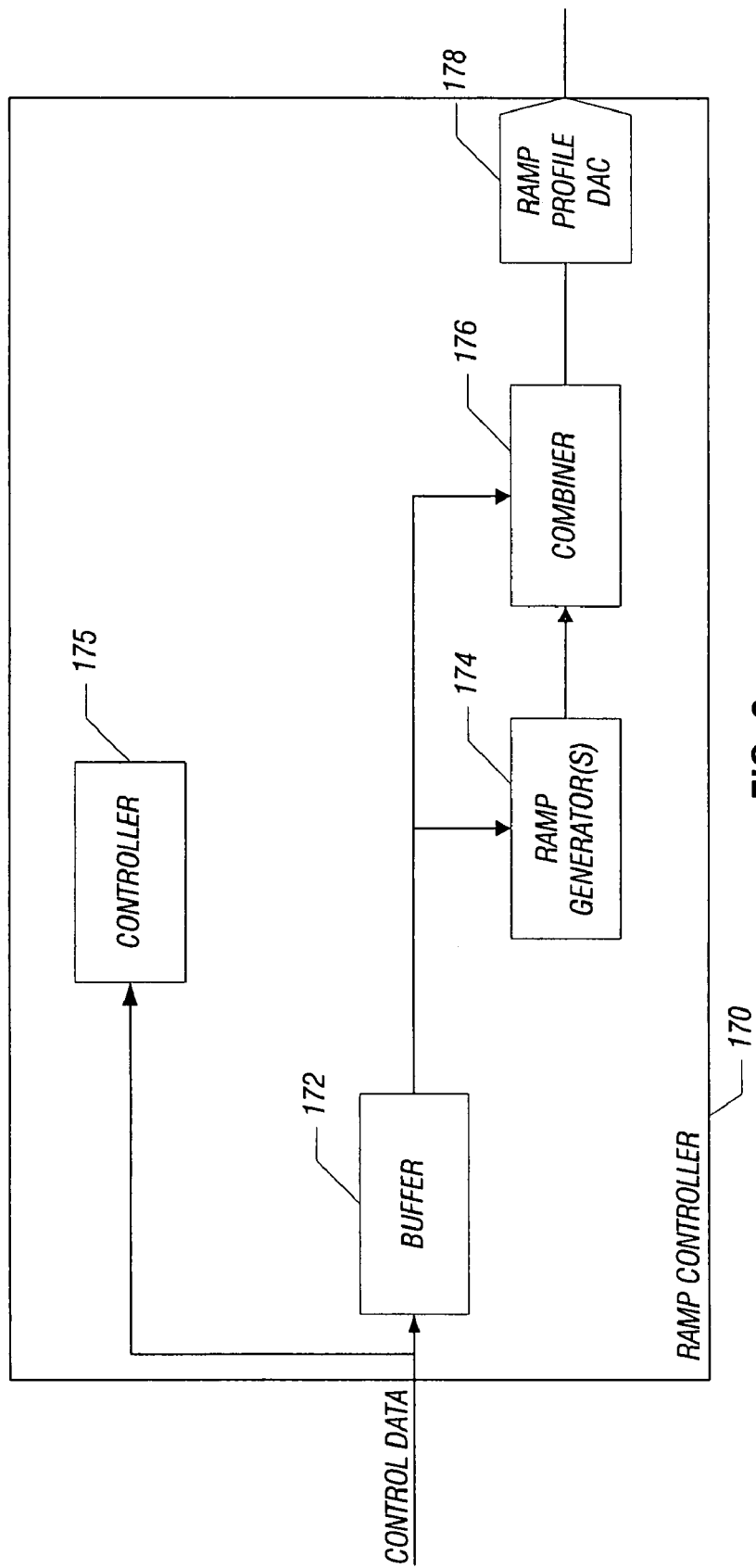
FIG. 3 is a block diagram of a ramp controller in accordance with an embodiment of the present invention.

Ramp controller 170 may take many different forms, in different embodiments. For example, in various implementations different amounts of hardware, software and/or firmware may be used to perform autonomous ramp generation as described herein. Referring now to FIG. 3, shown is a more detailed block diagram of a ramp controller in accordance with an embodiment of the present invention. As shown in FIG. 3, ramp controller 170, which may correspond to ramp controller 170 described above in FIG. 2, may be coupled to receive incoming control data. Specifically, this control data may be a minimal amount of control information received from a baseband processor. In some embodiments, this control information may include a minimum value on a per multi-slot burst basis, as well as individual maximum values for each burst of the communication. This minimum and maximum data may be provided to a buffer 172. Additional control information, e.g., timing information, flag information to indicate whether a corner timing case exists (or other information) may further be received and provided to a controller 175. Based on the control information received, controller 175 may control operation of ramp controller 170.

Referring still to FIG. 3, based on the minimal control information stored in buffer 172, one or more ramp generators 174, under control of controller 175, may generate ramp profiles. Specifically, such ramp generators may be dedicated engines to generate a ramp profile, e.g., in accordance with a raised cosine profile. This dedicated hardware may perform operations based on predetermined coefficient data present in the ramp generator, as well as the minimum and maximum value data received. The generated ramp profile may then be provided to a combiner 176. Combiner 176 may be used to add an offset to the generated ramp to thus obtain the ramp sample. The resulting ramp sample may be provided to a ramp DAC 178 for conversion to an analog signal. In instances in which a narrow timing tolerance is present, multiple ramp generators 174 may independently generate up and down ramps, which may then be summed within combiner 176. The resulting analog ramp profile may be provided to its intended location, e.g., AVGA 158 of transceiver 110 or PA 180. While shown with this particular implementation in the embodiment of FIG. 3, understand that the scope of the present invention is not limited in this regard and other implementations are possible.

While the discussion above with regard to FIG. 1 describes autonomous generation of ramp profiles at a high level, in particular embodiments additional features may be enabled to handle various corner timing cases that may exist. Such corner cases may be present in a given transceiver as a result of different environmental conditions that can exist in a mobile station. For example, when a mobile station is operating in dual modes, e.g., GMSK and 8-PSK, mode switching of various components within the transceiver is performed during a guard interval between the different slots of a multi-slot communication. However, it is possible, particularly in instances when a mobile station is relatively far from a base station, that a limited amount of time exists during this guard interval to perform needed mode switching. Furthermore, in some implementations minimal guard time may exist even when mode switching is not to be performed, i.e., when each burst is of a single modulation scheme. Accordingly, in some implementations finer control of ramp profiles may be effected to enable smooth generation of ramp profiles, even in such extreme conditions.

Figure 4:
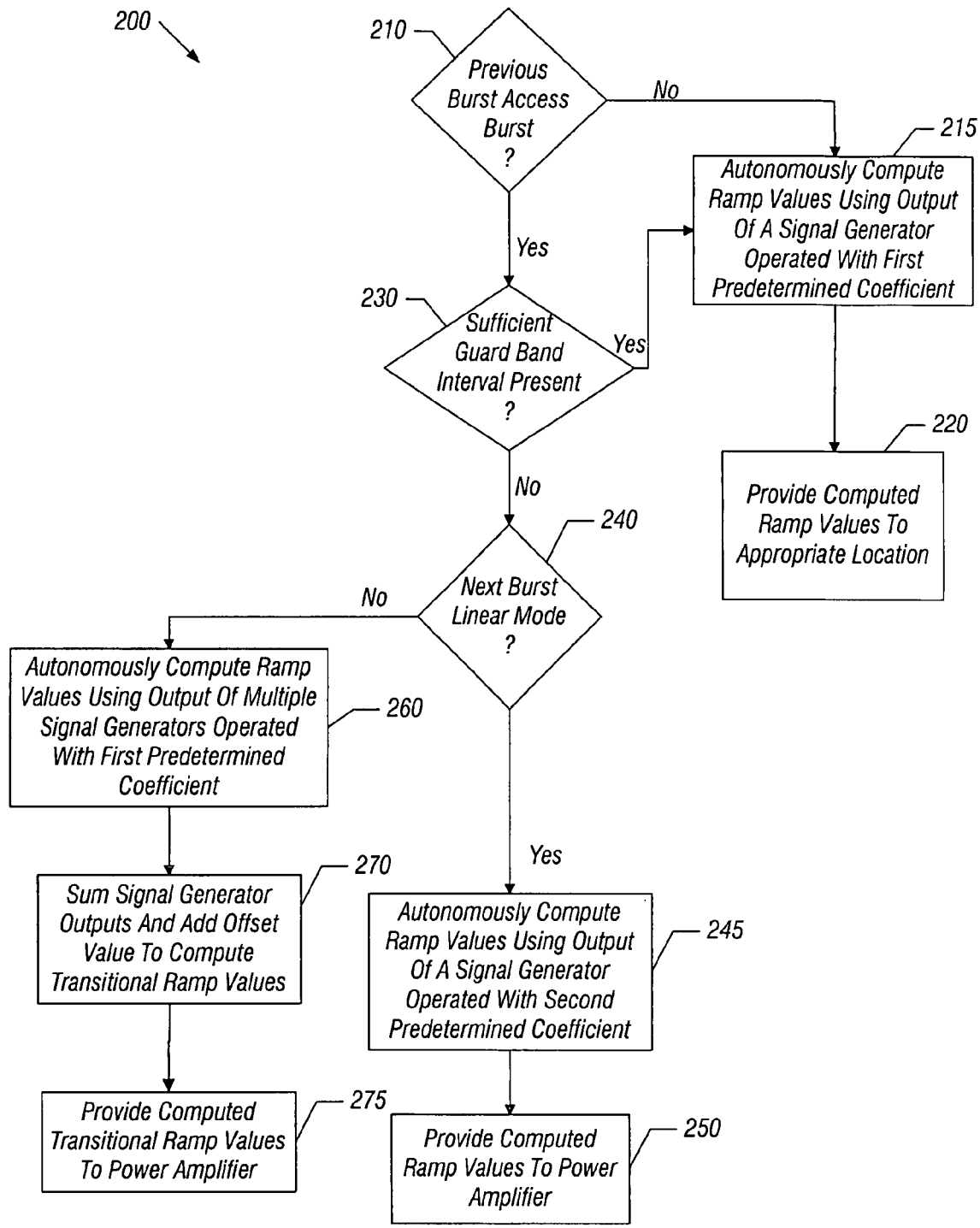
FIG. 4 is a flow diagram of a method for generating ramp profiles in accordance with another embodiment of the present invention.

Referring now to FIG. 4, shown is a flow diagram of a method for generating ramp profiles in accordance with another embodiment of the present invention. As shown in FIG. 4, method 200 may be implemented within a transceiver to autonomously generate ramp profiles, and more particularly to generate such ramp profiles in instances where a potentially limited amount of guard space is available between bursts of a multi-slot communication burst. As shown in FIG. 4, method 200 may begin by determining if a previous burst was an access burst (diamond 210). If not, this is an indication that sufficient time may be present between bursts to enable ramp computation and generation such as set forth above with regard to FIG. 1. Accordingly, as shown in blocks 215 and 220, ramp values may be autonomously computed and provided to the intended location. For example, a first predetermined coefficient may be used to generate an output from a single signal generator that is used to generate ramp profile data that can be used within the transceiver itself (e.g., in an 8-PSK mode) or sent to an associated PA (e.g., in a GMSK mode). Note that because sufficient time may exist between slots, the first predetermined coefficient may be a relatively precise value so that a greater amount of ramp samples may be generated, e.g., 14 samples, enabling a smoother ramp generation.

If instead at diamond 210 it is determined that a previous burst was an access burst, control may pass to diamond 230. At diamond 230, it may be determined whether a sufficient guard band interval is present. For example, generally in a multi-slot communication burst, somewhere between 8-9 symbol times may be a standard guard band, which can provide sufficient time for mode switching, ramp generation and so forth. However, when a previous burst is an access burst that is uncorrected with respect to timing differences between mobile station and associated base station, the access burst can float within its slot and can even bleed over into the succeeding guard band. If a sufficient guard band exists, e.g., a width of 8 or more symbols, control may pass to block 215 discussed above, where ramp data may be generated (such as described above with regard to FIG. 1).

If instead it is determined that an insufficient guard band interval exists, control may pass to diamond 240. At diamond 240 it may be determined whether the next burst is a linear mode burst, such as may be present in a 8-PSK mode of operation. If so, mode switching of the transceiver is to occur between the access burst and the next burst. Accordingly, control passes to block 245 where ramp values may be autonomously computed. However, because of the limited time for computing and generating a ramp profile along with mode switching, the ramp values may be generated using a second predetermined coefficient (block 245). This coefficient may be smaller or less precise such that fewer ramp samples are generated than if sufficient time exists. For example, instead of the 14 samples as described above, 10 samples may be generated in this limited time frame. These computed ramp values may be provided to the PA for use in ramp generation (block 250).

Referring still to FIG. 4, if instead at diamond 240 it is determined that the next burst is a non-linear mode burst, control passes to block 260. That is, although there may be no need for mode switching between the access burst and the succeeding normal mode burst (e.g., a GMSK mode burst), there is still a limited time window for generating a down ramp for the access burst as well as generating the up ramp for the next burst. Accordingly, multiple signal generators may be used, each of which may generate ramp profile information that can then be summed together. Thus as shown in FIG. 4, the first predetermined coefficient may be used by two signal generators for computations, the outputs of which may then be summed together and combined with an offset value to generate a smooth transitional ramp (blocks 260 and 270). This ramp profile information may then provided to the PA for ramp generation (block 275). While shown with this particular implementation in the embodiment of FIG. 4, the scope of the present invention is not limited in this regard.

Figure 5:
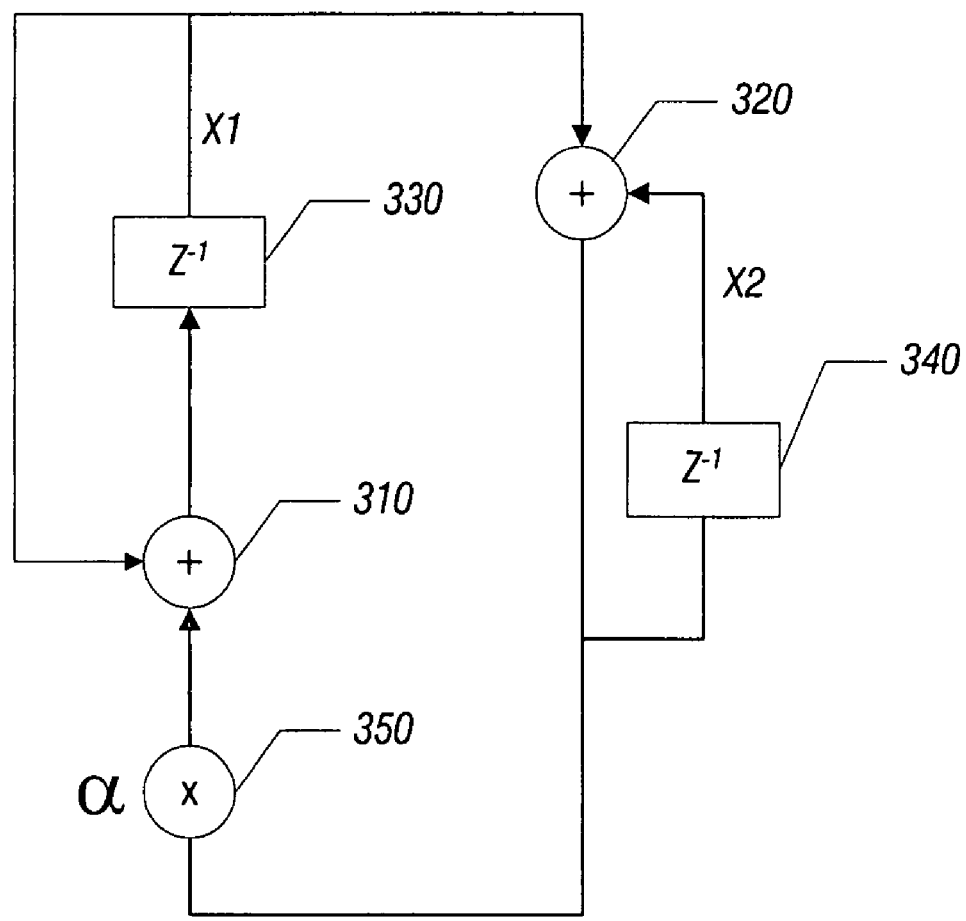
FIG. 5 is a block diagram of a ramp generator in accordance with one embodiment of the present invention.

As described above, ramp generators may take various forms in different embodiments. For example, in some implementations a ramp generator may be formed of dedicated hardware, while in other embodiments, a ramp generator may take the form of code that runs on a processor, such as a digital signal processor (DSP) or other such processing engine. Referring now to FIG. 5, shown is a block diagram of a ramp generator, e.g., a hardware engine, in accordance with one embodiment of the present invention. As shown in FIG. 5, ramp generator 174 may be an implementation of a resonator, although the scope of the present invention is not limited in this regard. That is, instead of an engine configured to calculate values with the hardware shown in FIG. 5, other engines or generators to calculate algorithmic values, e.g., in accordance with a polynomial equation, a spline algorithm, or so forth may also be used. As shown in FIG. 5, ramp generator 174 may have a first summer 310 coupled to receive an output of a first delay element 330 (i.e., X1) and an output of a multiplier 350. The summed signal from first summer 310 is provided to first delay element 330.

Referring still to FIG. 5, a second summer 320 is coupled to receive the output of first delay element 330 and an output of a second delay element 340 (i.e., X2). The output of second summer 320 is in turn coupled, both to the input of second delay element 340 and multiplier 350. Multiplier 350 may perform a multiplication between this input and a predetermined coefficient value, a. In various embodiments, the predetermined coefficient may vary depending on an amount of time available for performing ramp profile generation, as described above with regard to FIG. 4. That is, when a sufficient guard band interval is present, a smaller valued coefficient may be used for the multiplication to enable generation of a ramp with a greater number of samples than is possible in instances where a degraded or reduced guard band interval is present. While shown with this particular implementation in the embodiment of FIG. 5, the scope of the present invention is not limited in this regard.

The hardware resonator of FIG. 5 may thus perform calculations in accordance with the following equations to obtain the outputs of delay elements 330 and 340:

$$zX1 = X1 - \alpha(X1 + X2) \qquad [1]$$

$$zX2 = X2 + X1 \qquad [2]$$

Combining the equations leads to:

$$z^2 X1 + z(\alpha - 2)X1 + X1 = 0 \qquad [3]$$

In the embodiment of FIG. 5, poles may be precisely on the unit circle, at an angle $\Theta$ given by:

$$-2\cos\Theta = \alpha - 2 \ [4], \text{ and thus } \Theta = \cos^{-1}(1 - \alpha/2) \text{ or } \alpha = 2(1 - \cos\Theta) \qquad [5]$$

For the structure of FIG. 5, the signals X1 and (X2+$z^{-1}$X2) are in quadrature, and a sinusoid of peak-to-peak amplitude A, where A may correspond to the amplitude of the ramp specified by the baseband processor, derived from values received from the baseband processor, i.e., A=min-max [6], may be obtained by initializing X1(0)=0 and X2(0)=−A. Using these values, an output Y of engine 174 may be obtained according to the following equation.

$$Y = \tfrac{1}{2}(X2(k+1) + X2(k)) \qquad [7]$$

This output, Y, may be obtained by taking half of the input to second delay element 340 and half of the output of second delay element 340.

Experiments indicate that raised cosine ramp profiles of controlled amplitude, frequency, and offset can be effectively used to construct power control ramps. Such profiles can be generated using the output Y of engine 174 as follows:

$$R(k) = A/2 + H + Y(k) \qquad [8]$$

where the resulting ramp signal, R(k), is a raised cosine with offset H (which may correspond to the minimum value received from the baseband processor) and peak value A. The frequency of the raised cosine may be determined by the choice of multiplier value, α.

In some embodiments, engine 174 can be implemented with limited-precision fixed-point arithmetic, and sufficient precision may be achieved for the target performance. In one embodiment, the coefficient used in multiplier 350 can be approximated using a 3-term binary value, or even fewer terms, to get sufficient frequency accuracy for the target performance, resulting in a very compact efficient hardware implementation. In one implementation, two values of a may be used. Specifically, for instances in which sufficient inter-burst guard intervals are present, i.e., a guard interval greater than a threshold value, α may correspond to:

$$\alpha = 1/32 + 1/128 + 1/256 \qquad [9]$$

Using this coefficient in multiplier 350 of engine 174, ramp profiles at 4× symbol rate may be generated with a total of 14 sample values from minimum to maximum. Where less than the threshold time exists in the inter-burst guard interval, a may correspond to:

$$A = 1/8 - 1/256 \qquad [10]$$

which may be used to generate ramp profiles at 4× symbol rate, with a total of 10 sample values from minimum to maximum.

As described above with regard to FIG. 4, in one embodiment the longer (i.e., 14 sample) ramp values may be used in all cases except for the unlikely case of multi-slot bursts with an access burst (AB) adjacent to (i.e., preceding) an 8-PSK normal burst (NB) and system timing advance greater than 61 such that the inter-slot mode switching interval is 6 symbol periods or less. To cover the case of an access burst preceding a GMSK normal burst and system timing advance greater than 61 (this case is not unlikely), two ramp profile generators may be implemented so that one can be generating the AB down ramp at the same time the other is generating the NB up ramp. The down and up ramps may then be summed prior to the addition of the offset term H, so that a smooth transitional ramp is generated even under these conditions of extreme system timing advance. More precisely, the down ramp generator may produce:

$$R_D(k) = A_D/2 + Y_D(k) \qquad [11]$$

while the up ramp generator produces:

$$R_U(k) = A_U/2 + Y_U(k) \qquad [12]$$

where both down and up ramps have zero offset value. The actual (transitional) ramp profile may then be generated by adding the common offset value H:

$$R(k) = R_D(k) + R_U(k) + H \qquad [13]$$

Note that if this corner case is not present, the second ramp profile generator may be powered down.

In various embodiments, 18-bit data paths (i.e., resolution for X1 and X2) may be more than sufficient to ensure finite-precision artifacts are acceptably small. In one embodiment, ramp control parameters to be received from a baseband processor or other source for autonomous ramp generation may include: A, which may correspond to a per burst power level; H, which may be an offset value per band or possibly channel (i.e., a function of frequency but not power level); and F, which may be a flag to indicate the need for a fast down ramp generation in the unlikely case of a 8-PSK normal burst following an access burst at high system timing advance.

Figure 6:
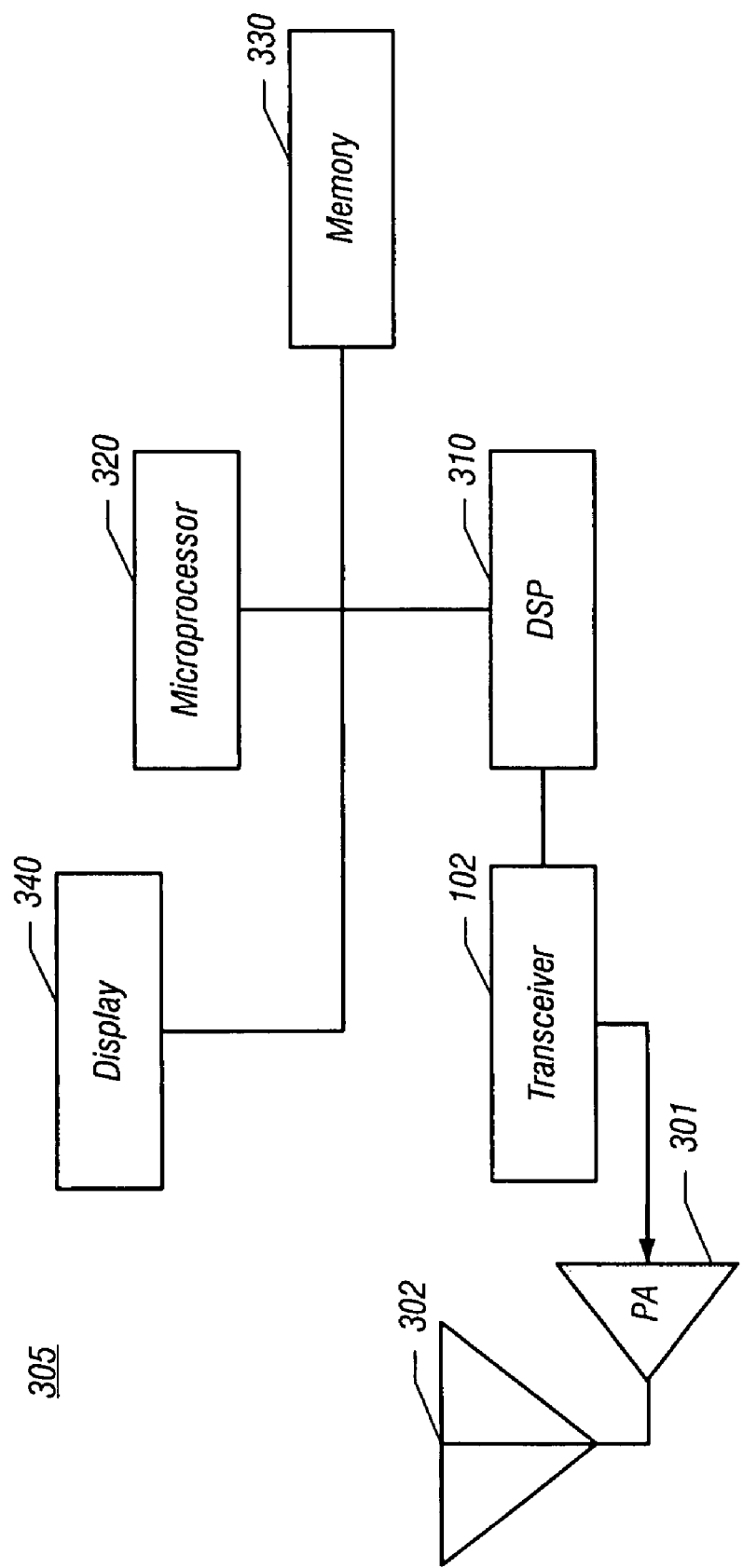
FIG. 6 is a block diagram of a system in accordance with an embodiment of the present invention.

A transceiver in accordance with an embodiment of the present invention can be implemented in many different systems. As one example, referring now to FIG. 6, shown is a block diagram of a system in accordance with an embodiment of the present invention. As shown in FIG. 6, system 305 may be a cellular telephone handset, although the scope of the present invention is not so limited. For example, in other embodiments, the system may be a pager, personal digital assistant (PDA) or other such device. As shown, an antenna 302 may be coupled via a PA 301 to a transceiver 102, which may correspond to transceiver 110 of FIG. 2. In turn, transceiver 102 may be coupled to a digital signal processor (DSP) 310, which may handle processing of baseband communication signals. In turn, DSP 310 may be coupled to a microprocessor 320, such as a central processing unit (CPU) that may be used to control operation of system 305 and further handle processing of application programs, such as personal information management (PIM) programs, email programs, downloaded games, and the like. Microprocessor 320 and DSP 310 may also be coupled to a memory 330. Memory 330 may include different memory components, such as a flash memory and a read only memory (ROM), although the scope of the present invention is not so limited. Furthermore, as shown in FIG. 6, a display 340 may be present to provide display of information associated with telephone calls and application programs. Although the description makes reference to specific components of system 305, it is contemplated that numerous modifications and variations of the described and illustrated embodiments may be possible. Furthermore, transceiver 102 and/or DSP 310 may include an article in the form of a machine-readable storage medium (or may be coupled to such an article, e.g., memory 330) onto which there are stored instructions and data that form a software program. The software program may provide for control of transceiver 102, e.g., for autonomously controlling generation of ramp profiles in transceiver 102 based on minimal control information from DSP 310. In turn, the ramp profiles may be used by transceiver 102 or by PA 301.

Thus in various embodiments, a transceiver may automatically compute the ramps on an as-needed basis. This can be done with a compact, efficient hardware implementation avoiding the expense of the memory-based solution, while providing a greatly simplified programming interface and very limited transceiver interface traffic.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving control information in a transceiver from a baseband processor;
   computing ramp values in the transceiver based on the control information; and
   outputting the ramp values to a power amplifier (PA) in a first mode of operation and providing the ramp values to a gain block of the transceiver in a second mode of operation.

2. The method of claim 1, further comprising computing the ramp values in a signal generator of the transceiver.

3. The method of claim 2, wherein the signal generator comprises an algorithmic generator.

4. The method of claim 1, wherein the control information comprises a single value per burst of a multi-slot burst transmission.

5. The method of claim 1, further comprising computing the ramp values for a first burst in a first signal generator and for a second burst in a second signal generator.

6. The method of claim 5, further comprising summing the ramp values for the first burst and the second burst and adding an offset to the summed ramp values, wherein the ramp values for the first burst comprise a down ramp and the ramp values for the second burst comprise an up ramp.

7. The method of claim 1, further comprising:
comparing a guard band interval between a first burst and a second burst of a multi-slot burst transmission to a threshold; and
computing the ramp values using a first coefficient or a second coefficient based at least in part on the comparison.

8. A transceiver comprising:
an interface to receive control data from a baseband processor;
a signal generator coupled to the interface to calculate ramp values based on the control data, the signal generator comprising an algorithmic hardware engine comprising:
a first summer to combine an output of a first delay element and an output of a multiplier; and
a second summer to combine the output of the first delay element and an output of a second delay element.

9. The transceiver of claim 8, wherein the multiplier is to multiply an output of the second summer by a predetermined value, the predetermined value selectable based on a control signal from the baseband processor.

10. The transceiver of claim 8, further comprising an adder coupled to sum an output of the algorithmic hardware engine and an offset value received from the baseband processor.

11. The transceiver of claim 10, further comprising a digital-to-analog converter (DAC) coupled to convert an output of the adder to an analog ramp signal, wherein the DAC is coupled to provide the analog ramp signal to a power amplifier coupled to the transceiver.

12. The transceiver of claim 8, wherein the signal generator comprises a first hardware engine and a second hardware engine, the second hardware engine to be enabled if less than a predetermined amount of a guard interval is available between a first burst and a second burst and a mode switch is to occur between the first burst and the second burst.

13. The transceiver of claim 8, wherein the control data comprises digital data including a single minimum value for a multi-slot burst communication and a maximum value for each slot of the multi-slot burst communication.

14. The transceiver of claim 8, further comprising a controllable amplifier to be controlled by the ramp values from the signal generator.

15. A system comprising:
a transceiver having a digital interface to communicate digital control information between a processor and the transceiver, and an engine coupled to the digital interface to autonomously generate ramp profiles based on the digital control information, wherein the engine comprises a first summer to combine an output of a first delay element and an output of a multiplier, a second summer to combine the output of the first delay element and an output of a second delay element, and an adder coupled to sum a value obtained from an input and the output of the second delay element and an offset value received from the processor;
a power amplifier coupled to the transceiver; and
an antenna coupled to the power amplifier to transmit and receive information.

16. The system of claim 15, wherein the power amplifier comprises a non-linear power amplifier to be controlled by the ramp values during a first modulation scheme.

17. The system of claim 16, wherein the transceiver further comprises a controllable amplifier to be controlled by the ramp values during a second modulation scheme.

18. An article comprising a machine-readable storage medium including instructions that enable a system to:
receive ramp control information from a processor;
automatically generate in a transceiver a first ramp profile for a first slot of a multi-slot burst communication using a first ramp value of the ramp control information and a first predetermined coefficient; and
selectively provide the first ramp profile to a controllable amplifier of the transceiver when a modulation scheme for the first slot is of a first type and instead provide the first ramp profile to a power amplifier coupled to the transceiver when the modulation scheme for the first slot is of a second type.

19. The article of claim 18, further comprising instructions that enable the system to determine if a guard interval between the first slot and a second slot of the multi-slot burst communication is of at least a predetermined interval.

20. The article of claim 19, wherein the instructions further enable the system to autonomously generate a second ramp profile for the second slot using a second ramp value of the ramp control information and a second predetermined coefficient if the guard interval is less than the predetermined interval.

21. The article of claim 18, further comprising instructions that enable the system to autonomously generate a second ramp profile for a second slot of the multi-slot burst communication using a second ramp value of the ramp control information and the first predetermined coefficient concurrently with autonomous generation of the first ramp profile for the first slot.

* * * * *